United States Patent [19]

Nishiyama et al.

[11] Patent Number: 4,803,636
[45] Date of Patent: Feb. 7, 1989

[54] CIRCUIT TRANSLATOR

[75] Inventors: Tamotsu Nishiyama, Hirakata; Toshinori Watanabe, Sagamihara; Noboru Horie, Takasaki; Makoto Furihata, Gunma; Yasuo Kominami, Takasaki; Fumihiko Mori, Yokohama, all of Japan

[73] Assignees: Hitachi Ltd.; Hitachi Micro Computer Eng. Ltd., both of Tokyo, Japan

[21] Appl. No.: 911,324

[22] Filed: Sep. 25, 1986

[30] Foreign Application Priority Data

Sep. 27, 1985 [JP] Japan .................. 60-213964

[51] Int. Cl.⁴ .................. G06F 7/00; G06F 15/60
[52] U.S. Cl. .................. 364/491; 364/488; 364/300; 364/900
[58] Field of Search ............ 364/488, 489, 490, 491, 364/300, 900

[56] References Cited

U.S. PATENT DOCUMENTS

| 4,580,228 | 4/1986 | Noto | 364/300 |
| 4,604,718 | 8/1986 | Normal et al. | 364/900 |
| 4,613,940 | 9/1986 | Shenton et al. | 364/490 |
| 4,703,435 | 10/1987 | Darringer et al. | 364/488 |
| 4,725,975 | 2/1988 | Sasaki | 364/900 |

FOREIGN PATENT DOCUMENTS

| 0004741 | 1/1980 | Japan | 364/490 |
| 0140733 | 7/1985 | Japan | 364/490 |
| 1445914 | 8/1976 | United Kingdom | 364/490 |

OTHER PUBLICATIONS

Geus et al., "A Ruled Based System for Optimizing Combinational Logic", IEE Design & Test, Aug. 1985.
Darringer et al., "Logic Synthesis Through Local Transformations", International Business Machine, 1981.
Hill et al., "Minimization of Boolean Functions", Introduction to Switch Theory and Logical Design, 1973.
Gilkinson et al., "Automated Technology Mapping", International Business Machine, 1984.
Parasch et al., "Development and Application of A Designer Oriented Cyclic Simulator", 13th DA Conference 1976.
Nakamura et al., "Logic Reorganization System" 15th DA Conference 1978.
Friedman et al., "Method Used in an Automatic Logic Design", IEE Transaction vol. C-18, No. 7, Jul. 1969.

Primary Examiner—Parshotam S. Lall
Assistant Examiner—Ellis B. Ramirez
Attorney, Agent, or Firm—Antonelli, Terry & Wands

[57] ABSTRACT

In order to translate an original circuit consisting of a set of first devices into a target circuit which consists of a set of second devices different from the first devices, and which has the same functions as the original circuit, provision is made of memory means for storing translation rules in the first devices, translation rules in the second devices, and translation rules between the first devices and the second devices, and translation means which successively refers to these translation rules and translates the original circuit data into the target circuit data via steps that translate the original circuit data into a plurality of intermediate data.

11 Claims, 13 Drawing Sheets

FIG. 6
| RULE NUMBER | CONDITIONAL PART (BEFORE TRANSLATION) | CONCLUSIVE PART (AFTER TRANSLATION) |
|---|---|---|
| RULE 1 |  | 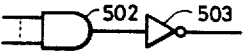 |
| RULE 2 |  | 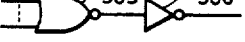 |
| RULE 3 |  |  |
| RULE 4 |  | 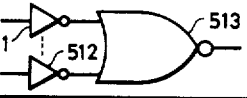 |
| RULE 5 | 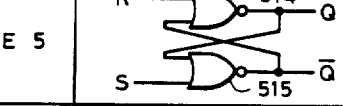 | 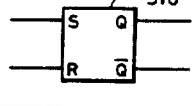 |
| RULE 6 |  | 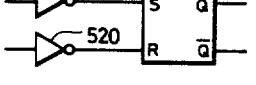 |
| ⋮ | ⋮ | ⋮ |

FIG. 7
| RULE NUMBER | CONDITIONAL PART (BEFORE TRANSLATION) | CONCLUSIVE PART (AFTER TRANSLATION) |
|---|---|---|
| RULE 1 | 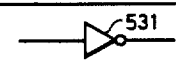 |  |
| RULE 2 | 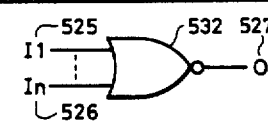 | 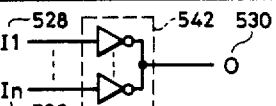 |
| RULE 3 | 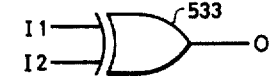 | 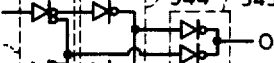 |
| RULE 4 | 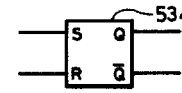 | 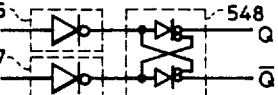 |
| ⋮ | ⋮ | ⋮ |

FIG. 8
| RULE NUMBER | CONDITIONAL PART (BEFORE ADJUSTING) | CONCLUSIVE PART (AFTER ADJUSTING) |
|---|---|---|
| RULE 1 | 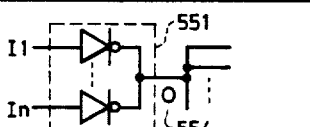 1≦N≦4 | 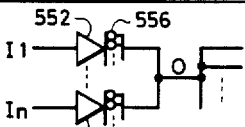 |
| RULE 2 | 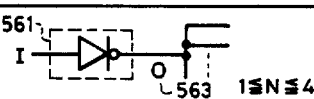 1≦N≦4 | 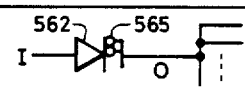 |
| RULE 3 | 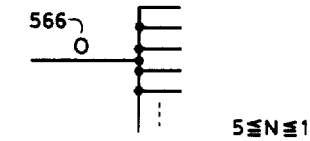 5≦N≦16 | 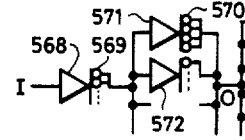 |
| RULE 4 | 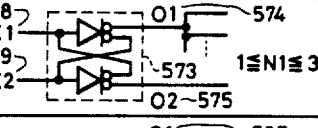 1≦N1≦3 | 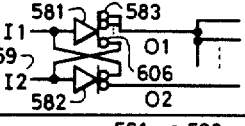 |
| RULE 5 | 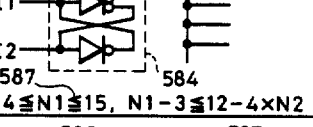 4≦N1≦15, N1-3≦12-4×N2 | 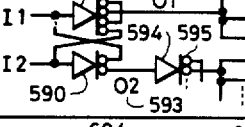 |
| RULE 6 | 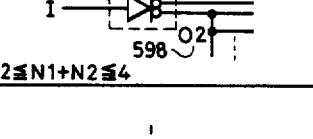 2≦N1+N2≦4 | 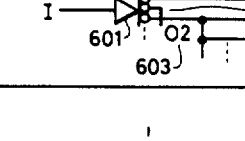 |
| ⋮ | ⋮ | ⋮ |

FIG. 9

| RULE NUMBER | CONDITIONAL PART (BEFORE TRANSLATION) | CONCLUSIVE PART (AFTER TRANSLATION) |
|---|---|---|
| RULE 1 | 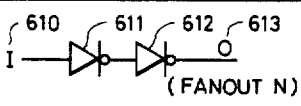 (FANOUT N)<br>[SIGNAL O : NO CONNECTION LOGIC<br>THE NUMBER OF COLLECTORS IN PRECEDING GATE OF SIGNAL I ≦ 5-N] | <br>[THE NUMBER OF COLLECTORS IN PRECEDING GATE OF SIGNAL I : INCREASED N-1] |
| RULE 2 | 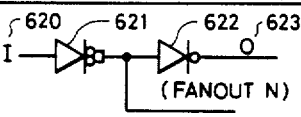 (FANOUT N)<br>[SIGNAL O : NO CONNECTION LOGIC<br>THE NUMBER OF COLLECTORS IN PRECEDING GATE OF SIGNAL I ≦ 4-N] | 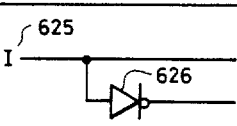<br>[THE NUMBER OF COLLECTORS IN PRECEDING GATE OF SIGNAL I : INCREASED N] |
| RULE 3 | 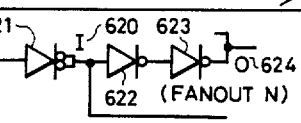 (FANOUT N)<br>[SIGNAL O : CONNECTION LOGIC EXIST<br>THE NUMBER OF COLLECTORS IN PRECEDING GATE OF SIGNAL I ≦ 5-N] | 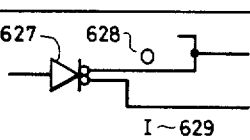<br>[THE NUMBER OF COLLECTORS IN PRECEDING GATE OF SIGNAL I : INCREASED N-1] |
| RULE 4 | 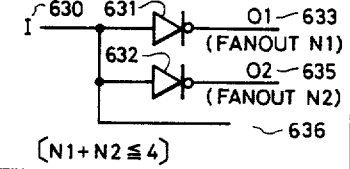 (FANOUT N1)<br>(FANOUT N2)<br>(N1+N2 ≦ 4) | 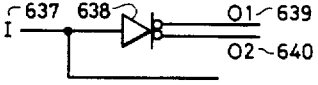<br>[THE NUMBER OF COLLECTORS IN PRECEDING GATE OF SIGNAL I : DECREASED 1] |
| RULE 5 | 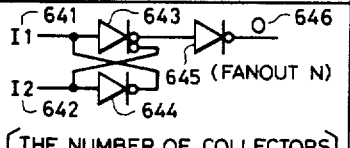 (FANOUT N)<br>[THE NUMBER OF COLLECTORS IN LATTER GATE OF SIGNAL I2 ≦ 4-N] | 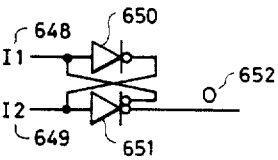 |
| ⋮ | ⋮ | ⋮ |

FIG. 15
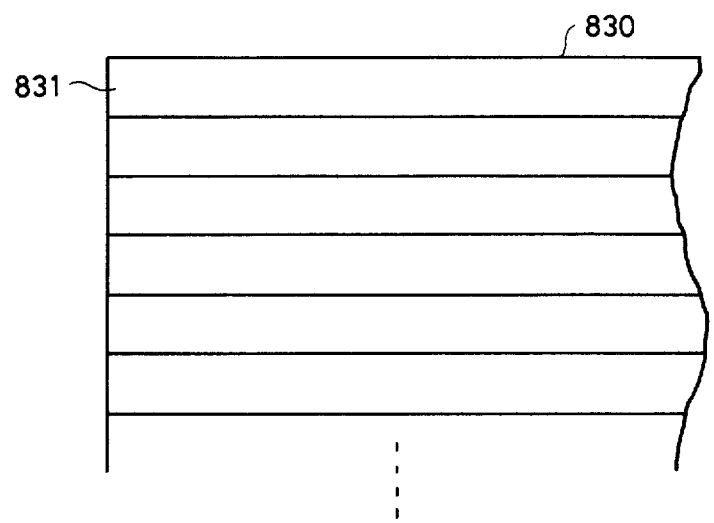
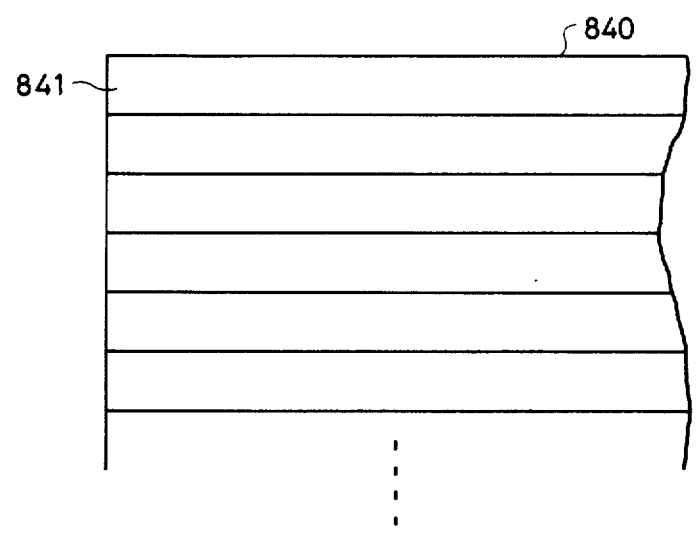

CIRCUIT TRANSLATOR

BACKGROUND OF THE INVENTION

The present invention relates to a circuit translator, and particularly to an apparatus for automatically translating logic circuits that are adapted to realizing the circuits having the same functions using devices of different technologies to automatically carry out the designing of semiconductors.

Analog-digital hybrid circuits have now been widely used, the analog circuitry being constituted by an IIL (integrated injection logic) or a TTL (transistor logic) and the digital circuitry being usually constituted by a CMOS circuit. The CMOS circuit, however, must be translated into an IIL circuit or a TTL circuit. This translation has heretofore been performed by human hand involving, however, a number of steps to carry out the design. In addition to the CMOS-IIL translation, furthermore, there are a TTL-CMOS translation, a TTL-ECL translation and like translations. Therefore, it has been desired to provide a method which is capable of automatically carrying out these translations.

A conventional method of automatically translating the circuit consists of detecting a part that is in agreement with an input pattern (pattern expressed by a connecting relation among the elements) defined in advance from an original circuit, i.e., from a circuit to be translated, and replacing this part by a corresponding output pattern according to conditions such as the number of fan outs of the output terminals (see, for example, Japanese Patent Application No. 82400/1985 which is a prior application filed by the inventors of the present invention and Appropriation Design Support Systems (1), (2), (3) using Knowledge Base by Kakimoto et al., Lectures in the 30TH National Convention of the Association of Information Processing, pp. 1923-1928, 1985). According to the above-mentioned method in which a plurality of output patterns are corresponded to each of the input patterns, however, the rules are necessary in a number equal to the number of the output patterns. Therefore, increased number of translation rules are necessary for all of the input patterns, and increased number of steps are required to prepare knowledge base (i.e., to prepare translation rules), presenting disadvantage with regard to efficiency and easiness for preparing the translation rules.

SUMMARY OF THE INVENTION

The object of the present invention is to provide a circuit translator which improves the aforementioned problems inherent in the conventional art, which automatically translates a circuit diagram that is necessary when the circuits having the same functions are to be realized using different devices, and which efficiently supports the logic design.

In order to achieve the above-mentioned object, the present invention deals with a circuit translator which comprises:
first memory means which stores translation rules in a set of first elements in order to translate an original circuit constituted by the set of the first element into a logically equivalent target circuit that is constituted by a set of second elements;
second memory means which stores translation rules in the set of the second elements;
third memory means which stores translation rules of from the set of the first elements into the set of the second elements; and
translation means which automatically selects suitable translation rules from said first memory means, which permits them to act upon individual or a plurality of elements of the original circuit data, which translates the data into first intermediate data, which automatically selects translation rules from said third memory means, which permits them to act upon individual or a plurality of elements of said first intermediate data, which converts the data into second intermediate data, which automatically selects the translation rules from said second memory means, and which permits them to act upon individual or a plurality of elements of said second intermediate data in order to translate them into target circuit data.

BRIEF DESCRIPTION OF THE DRAWINGS

FIG. 6 is a diagram which concretely illustrates basic concept extracting rules used in the present invention;

FIG. 7 is a diagram which concretely illustrates basic concept translating rules used in the present invention;

FIG. 8 is a diagram which concretely illustrates target circuit generating rules used in the present invention;

FIG. 9 is a diagram which concretely illustrates target circuit optimizing rules used in the present invention;

FIG. 15 is a diagram showing the format of a region for temporarily storing the data before and after the translation used in the present invention.

DETAILED DESCRIPTION OF THE PREFERRED EMBODIMENTS

Figure 2:
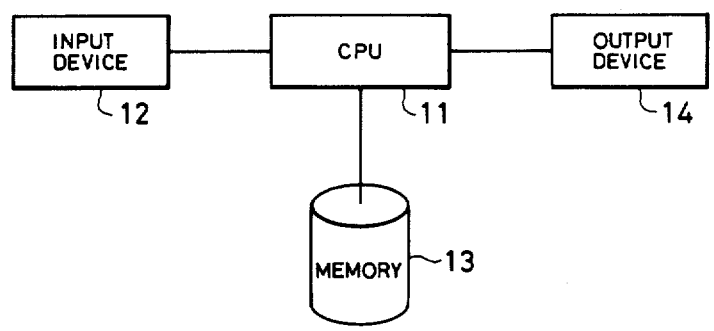
FIG. 2 is a diagram showing a computer system to which the present invention is adapted.

FIG. 2 is a block diagram of a processing system to which the present invention is adapted. In FIG. 2, a central processing unit (CPU) 11 performs processing for recognizing the elements of a circuit to be translated and for recognizing circuit connection data relying upon the input data, processing for translating an original circuit into a target circuit, processing for optimizing the target circuit, and processing for preparing a circuit diagram from the final results. An input device 12 inputs elements of the circuit to be translated and circuit connections. A memory 13 stores a group of circuit translating rules, a group of circuit optimizing rules, and a program for processing the translation operation. An output device 14 produces an intermediate result after the circuit translation or a circuit diagram of the final result. Concretely speaking, examples of the input device 12 can be divided into two groups, one group including a digitizer which directly reads the drawing of input circuit, a light pen, a tablet, a mouth, an OCR, a keyboard and a card reader, and another group including a magnetic tape which stores the input circuit data that have been once read, and a magnetic disc. An example of the memory 13 may be a magnetic disc. Further, examples of the output device 14 include figure output devices such as a plotter, a printer and a graphic display, as well as data memories such as a magnetic disc and a magnetic tape.

According to a circuit translating system of this embodiment, the original circuit data are input through the input device 12, are subjected to the circuit translation, and target circuit data are produced to the output device 14. The translation processing program effects the translation processing using a group of translation rules stored in the memory 13.

When a circuit having the same function as the electronic circuit realized with the existing device A is to be realized using a device B of a different technology (CMOS, TTL, ECL, IIL or the like), it is necessary to translate the diagram of logic circuit of the existing electronic circuit (device A) into the diagram of logic circuit that is in agreement with the technology of the device B, in order to utilize it for the operation of circuit simulation or chip layout. When the circuit translation is to be carried out automatically, the translation rule varies depending upon the connecting relation among the elements in the circuit to be translated, i.e., in the original circuit, or depending upon the functions of the elements. Therefore, the translation rules become complex and large in number.

According to this embodiment, the circuit translation is divided into three stages, i.e., translation in the original circuit system, translation from the original circuit system into the target circuit system, and translation in the target circuit system, and these translations are carried out according to rules (knowledge) from the viewpoint of knowledge technology and are utilized. In the translation in the original circuit system, the circuit structure is recognized from a connecting relation among the elements in the original circuit (circuit to be translated). Then, the original circuit is translated into an intermediate expression in the original circuit, i.e., translated into a conceptive expression constituted only by those elements that serve as bases of translation from the original circuit system into the target circuit system in accordance with the circuit structure which has recognized the original circuit, and part dependent upon the technology of the original circuit is removed. In the translation from the original circuit system into the target circuit system, the intermediate expression in the original circuit system is translated into the intermediate expression in the target circuit system. Finally, in the translation in the target circuit system, the technology of the target circuit system is adjusted relying upon the intermediate expression, and elements are formed to obtain the target circuit. Moreover, redundant logic parts are removed to optimize the target circuit. Owing to this method, (a) translation rules in the same circuit system (technology) can generally be obtained relatively easily relying upon the Boolean algebra, (b) translation between the different circuit systems (technologies) can be effected by utilizing only those translation rules of basic translations, and (c) adjustment of technology such as adjustment of fan outs can be easily performed in accordance with the rules if it is treated separately from the translation between the technologies.

Figure 3:
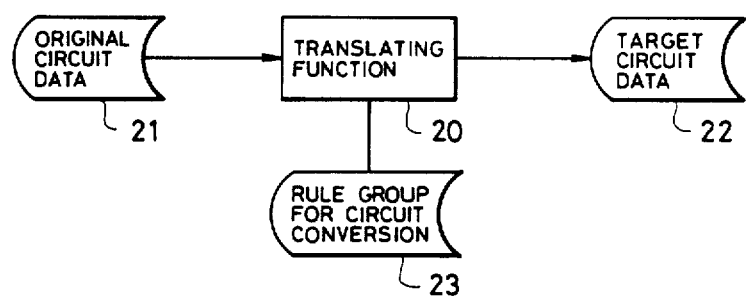
FIG. 3 is a block diagram illustrating the functions of FIG. 2.

FIG. 3 is a block diagram illustrating the functions of the central processing unit of FIG. 2. A translating function 20 of the central processing until 11 applies a suitable rule in a rule group 23 to the input original circuit data 21 by using a rule group 23 for circuit translation stored in the memory 13, and translates the original circuit data 21 into target circuit data 22.

Figure 1:
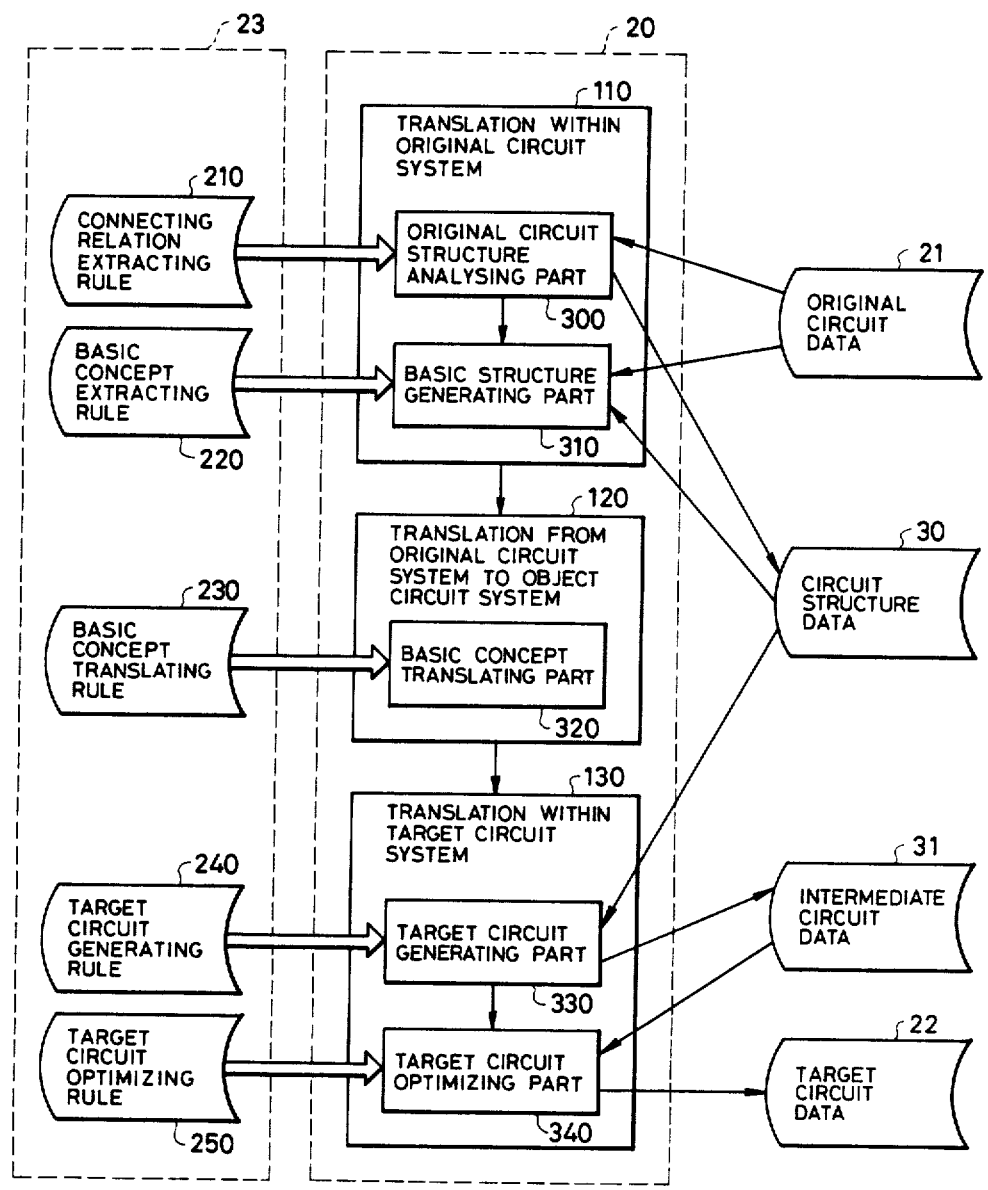
FIG. 1 is a schematic diagram showing the flow of a circuit translation processing according to an embodiment of the present invention.

FIG. 1 is a diagram illustrating a relationship between the translating function and the rule group for circuit translation according to an embodiment of the present invention. The translating function 20 has three processing blocks consisting of a translating part 110 in the original circuit system, a translating part 120 from the original circuit system into the object circuit system, and a translating part 130 in the target circuit system.

The processing block 110 consists of an original circuit structure analyzing part 300 and a basic structure generating part 310. The structure analyzing part 300 reads the original circuit data 21, selects a suitable rule from a connecting relation extracting rule group 210, permits the rule to act upon the original circuit data, analyzes the structure of the original circuit, and prepares circuit structure data 30. The basic structure generating part 310 translates the original circuit data 21 or a part thereof into an intermediate expression which consists of only the elements or concepts that serve as bases of translation, by using a rule of a basic concept extracting rule group 220. The above-mentioned processing may use the circuit structure data, as required.

The processing block 120 consists of a basic concept translating part 320 which receives the intermediate expression in the original circuit system, and applies thereto a rule of a basic concept translating rule group 230 in order to translate it into an intermediate expression (i.e., an expression constituted by only the elements or concepts on the side of the target circuit system that serves as bases of translation) in the target circuit system.

The processing block 130 consists of a target circuit generating part 330 and a target circuit optimizing part 340. The target circuit generating part 330 receives the intermediate expression of the target circuit system, forms the elements of the target circuit system from the intermediate expression by using a rule of a target circuit generating rule group 240, so adjusts the circuit that the target circuit exhibits a function equivalent to that of the original circuit while making reference to the circuit structure data 30 of the original circuit, and, as a result, prepares intermediate target circuit data 31. To simplify the processing in this embodiment, the target circuit generating part 330 forms the elements and, at the same time, adjusts the circuit. In practice, however, the target circuit generating part 330 may be separated into an element forming part and a circuit adjusting part. Moreover, a common file may be used for the intermediate circuit data 31 and the target circuit data 22.

The target circuit optimizing part 340 performs optimization such as removing redundant logic portions from the intermediate target circuit data 31 obtained as a result of the target circuit generating part 330, and putting a group of monofunctional elements into a composite form, by using a rule of a target circuit optimizing rule group 250, and produces, as a final result, target circuit data 22.

The processings of the processing blocks 310, 320 and 330 can be successively executed for the original circuit as a whole, or can be successively executed for each of the monofunctional element groups (i.e., for each of the sets of elements constituting a single function or for each of the elements) of the original circuit.

Described below are a circuit translation from the CMOS logic into the IIL logic and the rule group 23 for circuit translation according to the embodiment.

The rule group 23 for circuit translation of FIG. 1 consists of five rule groups, i.e., a connecting relation extracting rule group 210, a basic concept extracting rule group 220, a basic concept translating rule group 230, a target circuit generating rule group 240 and a target circuit optimizing rule group 250, that are corresponded to the processing blocks 300, 310, 320, 330 and 340, respectively. Prior to describing these rule groups, the difference between the CMOS logic circuit and the IIL logic circuit will be described, first. In the CMOS, in general, the wired logic is inhibited, and the description is realized using general logic symbols. On the other hand, the IIL is basically constituted by a lateral pnp transistor and an inverse npn transistor.

Figure 4:
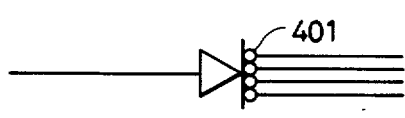
FIG. 4 is a schematic diagram of an II element employed in the present invention.

FIG. 4 is a diagram which schematically illustrates the IIL element, wherein symbol 401 represents the collector areas of the npn transistor, the number of the collectors 401 being proportional to the number of fan outs. A maximum number of the collectors 401 is four for a single IIL element. Logically, the IIL element is an inverter (NOT element). The IIL which basically consists of wired logic is not described using general logic symbols, but is described using IIL elements shown in FIG. 4 (as well as cells that represent a flip-flop relationship) and wired logics thereof.

Figure 5:
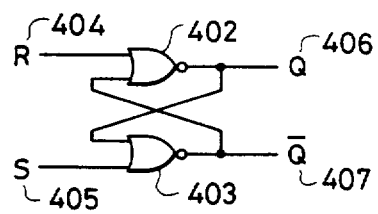
FIG. 5 is a diagram illustrating the structure of an SR latch made up of NOR gates employed in the present invention.

FIG. 5 is a diagram illustrating a rule which pertains to the connecting relation extracting rule 210 of FIG. 1. FIG. 5 exemplifies a rule which recognizes an SR latch. If described in accordance with the IF-THEN type rule (see Japanese Patent Application No. 79341/1983, "System for Controlling Facility Groups"), this can be written as follows:

IF: there are two-input NOR gates 402, 403, the input signals for the gate 402 being R404 and 407, the output signal being Q406, the input signals for the gate 403 being S405 and Q406, and the output signal being Q407, THEN: the gates 402 and 403 form an SR latch.

In addition to the above-mentioned recognizing rule, the connecting relation extracting rule 210 further includes a rule that examines the number of output supplying elements (number of fan outs) or the number of inputs signals (number of fan ins) for each of the elements.

FIG. 6 is a diagram showing a list of rules that pertain to the basic concept extracting rule 200 of FIG. 1. Here, a diagram of the original circuit constituted by the logic gates such as NAND gate 501, AND gate 502, inverter 503, OR gate 504, NOR gate 505, ENOR (exclusive NOR) gate 507, EOR (exclusive OR) gate 508, and SR latch 516, is translated into an intermediate expression which is constituted by concepts of NOR gate 505, inverter 503 and SR latch 516 according to rules of FIG. 6. The translation rules of FIG. 6 will be briefly described. The rule 1 translates an n-input NAND gate 501 into an n-input AND gate 502 and an inverter 503. The rule 2 translates an n-input OR gate 504 into an n-input NOR gate 505 and an inverter 506. The rule 3 translates an ENOR gate 507 into an EOR gate 508 and an inverter 509. The rule 4 translates an n-input AND gate 510 into n inverters 511,—, 512 and an NOR gate 513, where n is a positive integer greater than 1. The rule 5 translates an SR latch consisting of NOR gates 514 and 515 into an SR latch symbol 516. The rule 6 translates NAND gates 517 and 518 into two inverters 519, 520 and an SR latch symbol 521. These rules can be easily prepared from the definitions of Boolean algebra or SR latch. Suitable priorities are attached to the rules of FIG. 6, and these rules are applied according to the priorities. The translation rule can be applied to the NAND gate, for example, in the following way. Namely, the rule 6 is applied, first. If this is not successful, then the rule 1 is applied. That is, the rule 6 has a priority over the rule 1.

FIG. 7 is a diagram showing a list of rules that pertain to the basic concept translating rule 230 of FIG. 1. In this case, the basic concept of the original circuit system (CMOS) consisting of inverter 531, NOR gate 532, EOR gate 533, and SR latch symbol 534, is translated into a basic concept which consists of a single IIL element 541, wired AND IIL element 542, and latch IIL element 548. However, these basic concepts do not take into consideration the number of collectors that are related to the increase or decrease of the supply current.

Translation rules of FIG. 7 will be described below in detail. The rule 1 translates an inverter 531 into a single IIL element 541. The rule 2 translates a NOR gate 532 which has input signals I1 (525),—, In (526) and an output signal 0 (527) into an n-input wired AND IIL element 542 which is constituted by IIL elements having an input signal I1 (528) and an output signal 0 (530), and an IIL element having an input signal In (529) and an output signal 0 (530), where n is a positive integer greater than 2. The rule 3 translates an EOR gate 533 into three two-input wired AND IIL elements 543, 544 and 545. Here, the wired AND IIL element 543 produces output signals of the two IIL elements in addition to the wired output signal. The rule 4 translates an SR latch 534 into two IIL elements 546, 547 and a latched IIL element 548. In the conclusion parts of the rules of FIG. 7, the parts surrounded by dotted lines represent basic concepts of the target circuit systems, i.e., represent conceptive elements that serve as bases of translation.

FIG. 8 is a diagram showing the target circuit generating rules 240 of FIG. 1. In the rules of FIG. 8, the basic concept (intermediate expression) of the target circuit system (IIL) is developed into an IIL element and a wired logic and, at the same time, the fan outs of the IIL element are adjusted (i.e., the number of collectors is so increased as to become equal to the number of fan outs). The rules of FIG. 8 will now be described in detail. First, the rule 1 translates an n-input wired AND IIL element 551 having n input signals I1, —, In and an output signal 0 into n IIL elements 552, —, 553 that have a common output signal 0 to form a wired logic and input signals I1, —, In. In the conditional part, however, there exists a prerequisite that the number of fan outs (i.e., the number of branches) N555 of the output signal 0554 assumes a positive integer of any one of 1, 2, 3 or 4, and each of the n IIL elements 552,—, 553 in the conclusion part has N collectors 556. The rule 2 translates an IIL element (conceptive IIL element) 561 which is not taking the number of collectors into consideration into an IIL element 562 that has collectors 565 of a number equal to the fan outs N of the output signal 0563. Here, the number N of fan outs is any one of 1, 2, 3 or 4. The rule 3 inserts an IIL element 568 and m IIL elements 571, 572, —in front of the signal 0 the m IIL elements 571, 572, —receiving the output signal of the IIL element 568 as an input signal, when the number N of fan outs of the output signal 0566 is a positive integer which is greater than 5 but is smaller than 16. The number m of IIL elements 571, 572, —, is given by the following relations:

If $5 \leq N \leq 8$, then m=2,
If $9 \leq N \leq 12$, then m=3, and
If $13 \leq N \leq 12$, then m=4.

The number of collectors 569 of the IIL element 568 is equal to the number m of the IIL elements 571, 572, —that receive the output signal of the IIL element 568 as an input signal. The number of collectors 570 of each of the IIL elements 571, 572, —assume integers of 1 to 4, and the total number of the collectors 570 is equal to N.

The rule 4 translates a latched IIL element 573 having input signals I1 (558) and I2 (559) into a pair of IIL elements 581, 582 which receives, as an input signal, the output signal of the other one. In the conditional part, there exists a prerequisite that the number N1 (576) of fan outs of output signal O1 (574) of the latched IIL element 573 assumes an integer of any one of 1, 2 or 3. In the conclusion part, N1 (576) collectors 583 of the IIL element 581 are connected to the output signal O1, and another collector 606 is connected to the input signal I2 (559) of the IIL element 582. Though this embodiment has taken the output signal 0 (574) only into consideration, the same also holds true even for the output signal O2 (575).

Like the rule 4, the rule 5 of FIG. 8 translates a latched IIL element 584 into a pair of IIL elements 589 and 590, and inserts IIL elements 594, —depending upon the number of fan outs of the output signal. In the conditional part, in particular, any one of the following prerequisites is satisfied by the number N1 (587) of fan outs of the output signal O1 (585) of the latched IIL element 584 or by the number N2 (588) of fan outs of the output signal O2, i.e., $4 \leq N1 \leq 7$ and $0 \leq N2$ 2,
or $8 \leq N1 \leq 11$ and $0 \leq N2 \leq 1$,
or $12 \leq N1 \leq 15$ and N2=0.

In the conclusion part, the number of collectors 591 of the IIL element 589 is four. Among them, one collector is connected to the input signal I2 of the IIL element 590, and the remaining three collectors are connected to the output signal O1 (592) to supply a current (signal) to the three gates. To the remaining N1-3 gates are supplied output signals of 1 IIL elements 594, —that receive, as an input signal, the output signal O2 (593) of the IIL element 590. Here, the number of the IIL elements 594 satisfies the following relations, i.e., If $4 \leq N1 \leq 7$, then l=1,
if $8 \leq N1 \leq 11$, then l=2, and
if $12 = N1 \leq 15$, then l=3.

The number of collectors of the IIL element 590 is 1+N2. Among them, one collector is connected to the input signal I1 of the IIL element 589. In this embodiment, the diagram of the case of N2 =0 is also shown. The same rule can be prepared even for those in which the conditions O1 and O2 are replaced.

When an IIL element 596 has two output signals O1 (597) and O2 (598), one (O1) of them forming a wired logic (i.e., the output signal O1 being connected to the output signal of the other gate), the rule 6 of FIG. 8 translates the IIL element 596 into an IIL element 601 which has N1 +N2 collectors and wherein N1 collectors 604 are connected to the output signal O1 (602) and the remaining N2 collectors 605 are connected to the output signal O2 (603). Here, the following requirement is satisfied by the number N1 (599) of fan outs of the output signal O1 (597) and by the number N2 (600) of fan outs of the output signal O2 (598), i.e., $$2 \leq N1+N2 \leq 4$$

In this embodiment, in particular, the diagram of the case of N1=1 is shown. From these rules, furthermore, a translation rule for the conceptive element 543 of FIG. 7 can be easily derived.

FIG. 9 shows a list of rules that pertain to the target circuit optimizing rule 250 of FIG. 1. For simple explanation, FIG. 9 shows only those diagrams in which the number of fan outs (number of branches) of the output signal 0 is 1. As examples of the target circuit optimizing rule, the rules described here are to reduce the number of IIL elements in the target circuit system (IIL). The rules of FIG. 9 will now be described in detail. The rule 1 of FIG. 9 is to remove IIL elements 611 and 612 that are connected in two stages in series. In the conditional part, the output signal 0 (613) does not form a wired logic relative to other output signals. For the number N of fan outs of the output signal 0 (613), furthermore, there exists a prerequisite that the number of collectors of the gate that produces the signal I (610) is smaller than 5−N. In the conclusion part, the number of collectors of the gate which produces the signal I (615) is increased by N−1. Further, the signal I (613) is transformed into the same signal I (615).

The rule 2 of FIG. 9 is to remove the IIL element when IIL elements 621 and 622 connected in two stages in series have a branch signal therebetween. In the conditional part, the output signal 0 (623) is not connected to the output signal of other gate. For the number N (624) of fan outs of the output signal 0 (623), furthermore, there exists a prerequisite that the number of collectors of the gate that a signal I (620) is smaller than 4−N. In the conclusion part, the output signal is changed into a signal I (625) for all gates that produce the signal 0 (623), and an IIL element 626 is inserted in the branch portion. Further, the number of collectors of the gate that produces the signal I (625) is increased by N.

The rule 3 of FIG. 9 removes IIL elements 622 and 623 which are connected in two stages in series and in which the output signal 0 (624) forms a wired logic with the output signal of other gate and in which the input signal I (620) is branched, and further divides the collector of an IIL element 627 to produce two output signals 0 (628) and I (629). In the conditional part, there exists a prerequisite that when the IIL element 623 has a fan out number N (624), the number of collectors of the IIL element 621 is smaller than 5−1. In the conclusion part, the number of collectors of the IIL element 627 is increased by N−1. Further, among the whole collectors of the IIL element 627, N collectors are connected to an output signal 0 (628) and the remaining collectos° are connected to a signal I (629).

The rule 4 of FIG. 9 unifies two IIL elements 631 and 632 having the same input signal I (620) into a single IIL element 638. In the conditional part, there exists a prerequisite that a fan out number N1 (634) of an output signal 01 (633) and a fan out number N2 (636) of an output signal 02 (635) establish the following relationship:

$$2 \leq N1 + N2 \leq 4$$

In the conclusion part, an IIL element 638 has N1−N2 collectors. Among them, N1 collectors are connected to an output signal 01 (639) and the remaining N2 collectors are connected to an output signal 02 (640). Further, the number of collectors of a gate that produces a signal I (637) is decreased by 1.

The rule 5 of FIG. 9 removes an IIL element 645 connected to a succeeding stage of an IIL element 643 that forms a latch together with an IIL element 644, and connects an output signal 0 (652) to another IIL element 651. In the conditional part, when the output signal 0 (646) has a fan out number N, there exists a prerequisite that the number of collectors of the IIL element 644 is smaller than 4−N. In the conclusion part, N collectors of the IIL element 651 are connected to an output signal 0 (652) and a collector among the remaining collectors is connected to an input signal I1 (648) of an IIL element 650.

For easy comprehension, the rules of FIGS. 6, 7, 8 and 9 were represented by diagrams. However, they can also be expressed using symbols or by a programming such as logical language PROLOG or the like. Further, these rules may contain variables. As explained in conjunction with FIG. 6, furthermore, priorities are suitably attached to the rules of FIGS. 6, 7, 8 and 9.

In the foregoing was schematically described the rule group 23 for circuit translation. Described below are examples to which are adapted the rules for circuit translation shown in FIGS. 6 to 9.

Figure 10:
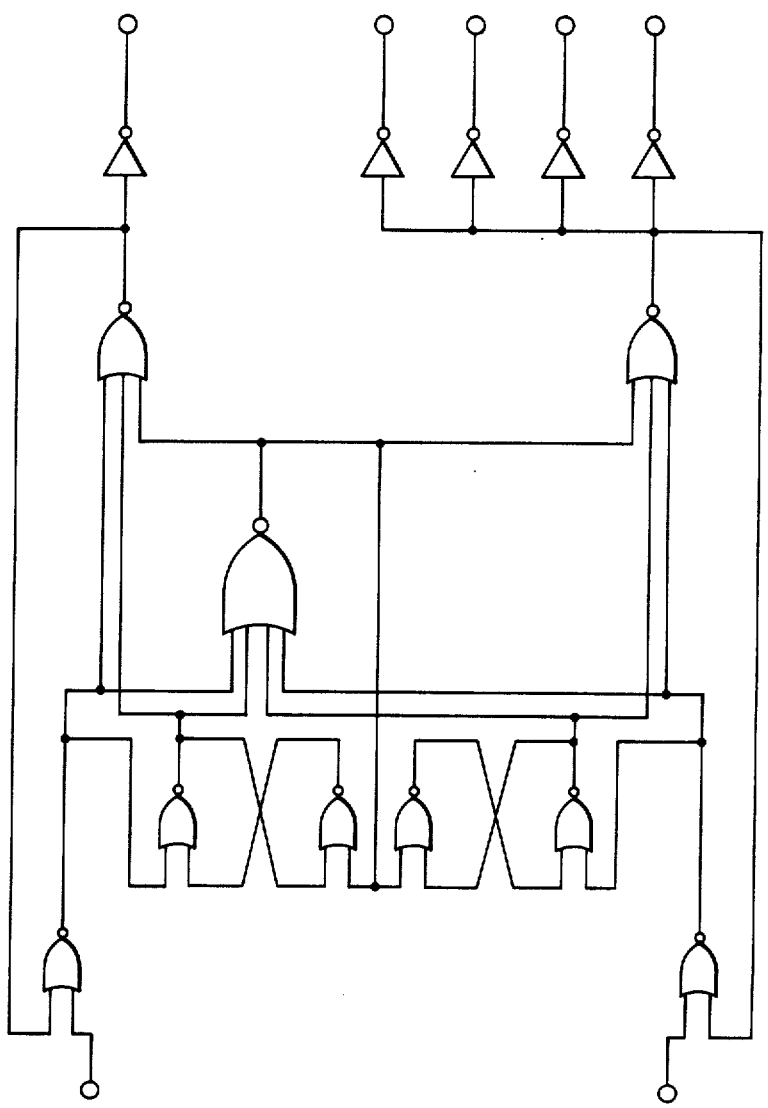
FIG. 10 is a diagram of a CMOS circuit to which the present invention is adapted.

FIG. 10 shows a logic circuit which is treated as an original circuit in this embodiment, and which is realized by NOR gates and inverter gates.

Figure 11:
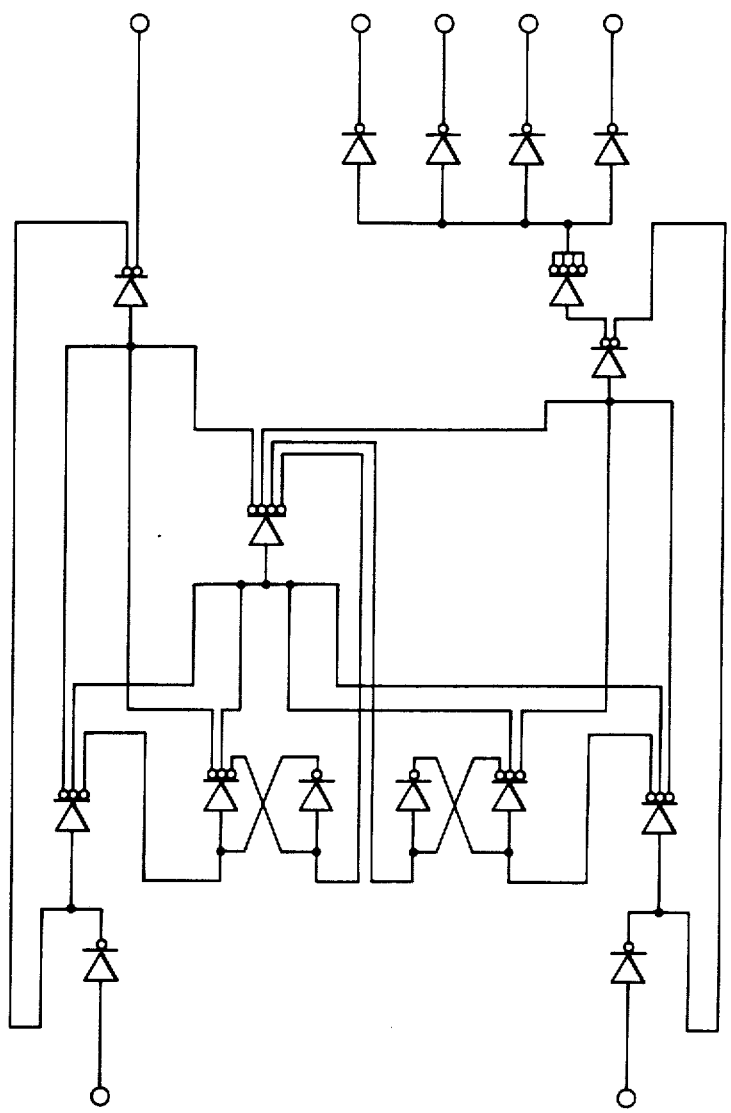
FIG. 11 is a circuit diagram of when the circuit of FIG. 10 is translated into an IIL circuit according to the present invention.

FIG. 11 is a diagram showing the results obtained when the logic circuit of FIG. 10 is translated in accordance with this embodiment. The processing for translating the logic circuit will now be described in detail.

Figure 12:
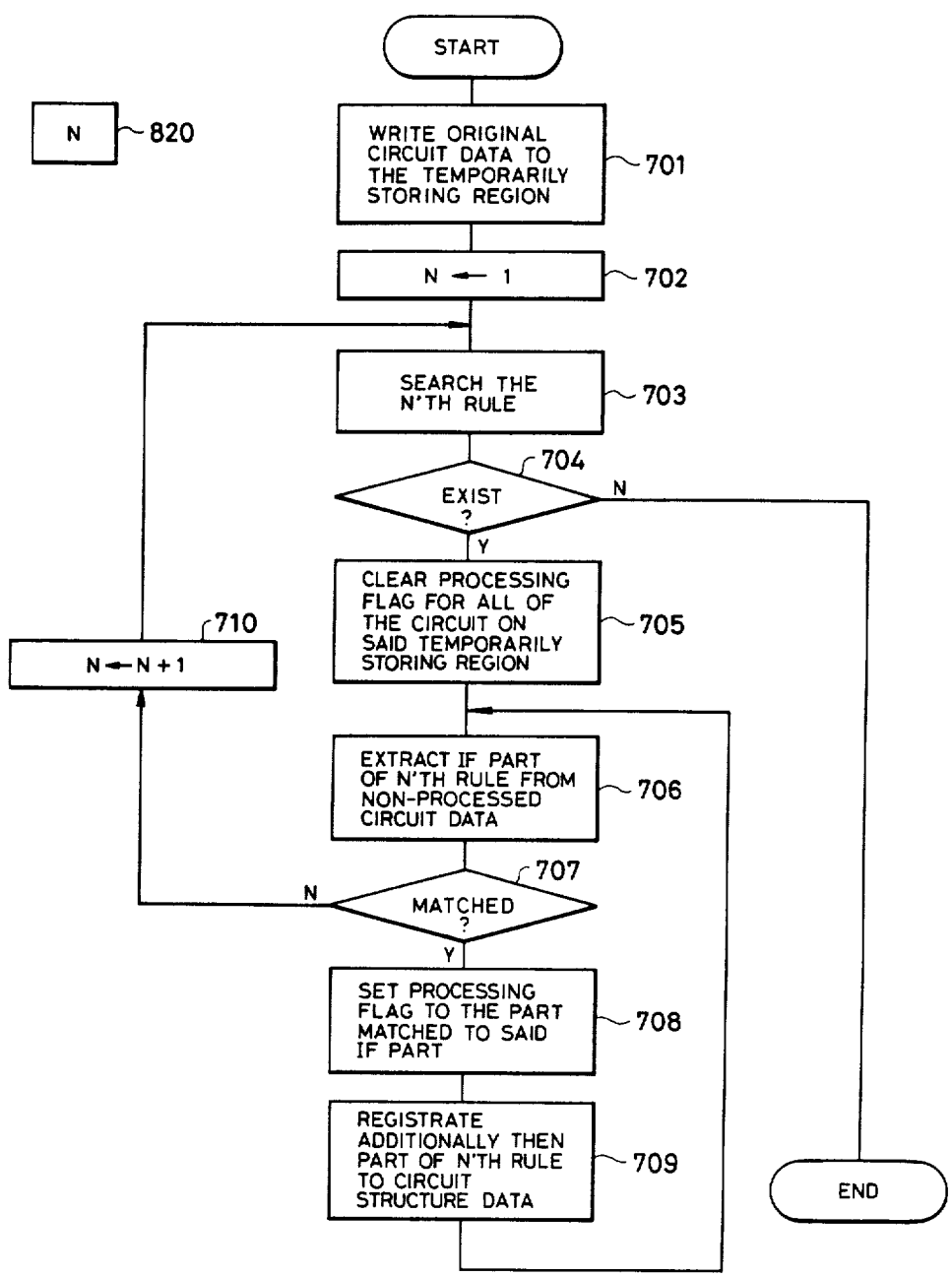
FIG. 12 is a flow chart illustrating the contents of processing of an original circuit structure analyzing part of the present invention.

FIG. 12 is a flow chart which schematically illustrates the processing in the original circuit structure analyzing part 300 of FIG. 1.

The internal expression of circuit data will now be described prior to explaining the processing of FIG. 12.

Figure 13:
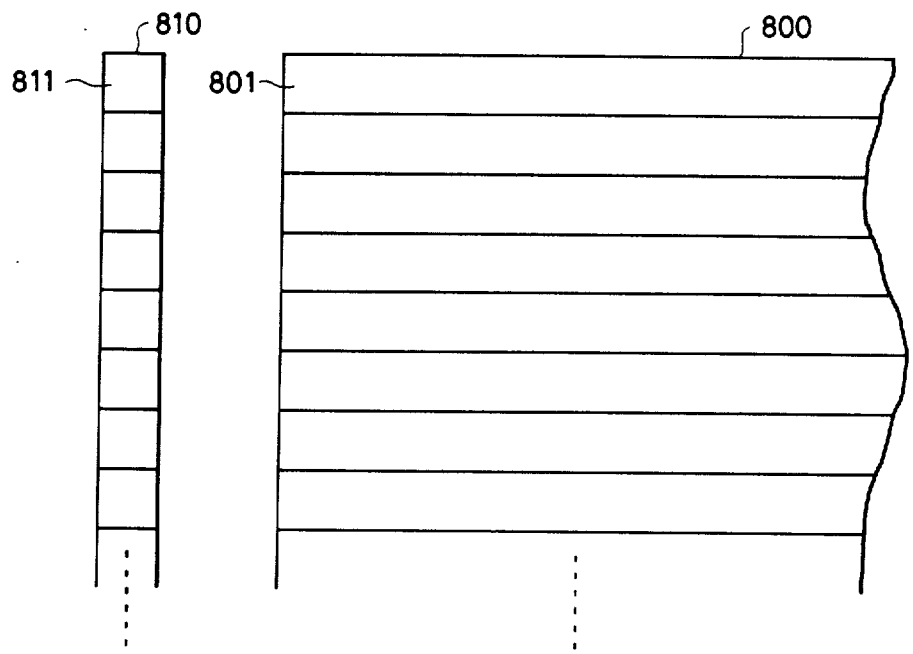
FIG. 13 is a diagram showing the format of a region for temporarily storing the circuit data used in the present invention.

FIG. 13 is a diagram showing the format of a region for temporarily storing the circuit data. The region 800 for temporarily storing the circuit data is an internal data area constituted by a set of ordered records 801 of variable lengths (or fixed lengths). Each record 801 stores data such as kind of logical elements, circuit system (i.e., CMOS, IIL, etc.), designation for discriminating the elements, list of input signals and list of output signals. When the records of the region 800 for temporarily storing the circuit data have been processed, a table 810 sets a value 1 to an area 811. When the records have not been processed, the table 810 sets zero to the area 811.

Contents of FIG. 12 will now be explained using the temporarily storing region 800. The original circuit data 21 is read and is set to the region 800 that temporarily stores the circuit data (step 701). Then, a value 1 is set to a priority number N for adapting the rules (step 702), where N denotes a number 820 attached to each of the rules according to the priorities for adapting the rules. The rule of a rule priority number N is retrieved from the connecting relation extracting rule group 210 (step 703). If the rule of the priority number N can be retrieved in the step 703, the processing is carried out in a step 705. If the rule is not retrieved, the processing of the original circuit structure analyzing part 300 is finished (step 704). The process flag table 810 of FIG. 13 is cleared (step 705). Next, a part having a pattern that matches an IF part (conditional part) of the rule of the priority number N retrieved in the step 703, is extracted from a part of a value 0 of the flag table 810 relying upon a data (record) in the temporarily storing region 800 of FIG. 13 (step 706). Here, the pattern matching mentioned here follows the rule described below.

(a) A variable matches with any value. Here, however, the same variable matches with the same value only. When a variable matches with some value, it can be so considered that an object that is matched exists there instead of the variable.

(b) A symbol matches with only a symbol that is equal thereto or with a variable (that does not have a value yet).

(c) A composite term matches with other composite term only when all of the elements thereof are matched. It matches with a variable (that does not have a value yet) as a matter of course.

(d) Otherwise, the two patterns do not match with each other.

In the step 706, if there exists a part of which the pattern matches with the IF part, the processing is carried out in a step 708. Conversely, if there does not exist such a part, the processing of a step 710 is carried out (step 707). If there exists the above-mentioned part, the region 800 for temporarily storing the circuit data sets a value 1 to a corresponding position on the flag table 810 that corresponds to the record of a part matching with the IF part in step 706 (step 708). Next, a THEN part (conclusion part) of the N-th priority number retrieved in the step 703, is additionally registered into the circuit structure data 30 according to a designated form (step 709). When there does not exist the part of which the pattern matches, 1 is added to the priority number N, and the resulting value is set again to N (step 710). A series of processing steps 705, 706, 707 and 708 can be easily carried out by describing the records of the circuit data temporarily storing region 800 as sentences of facts, and using a unification function or a backtrack function (e.g., see W. F. Clocksin, C. S. Mellish: Programming in PROLOG, Springer-Verlag, 1981).

Figure 14:
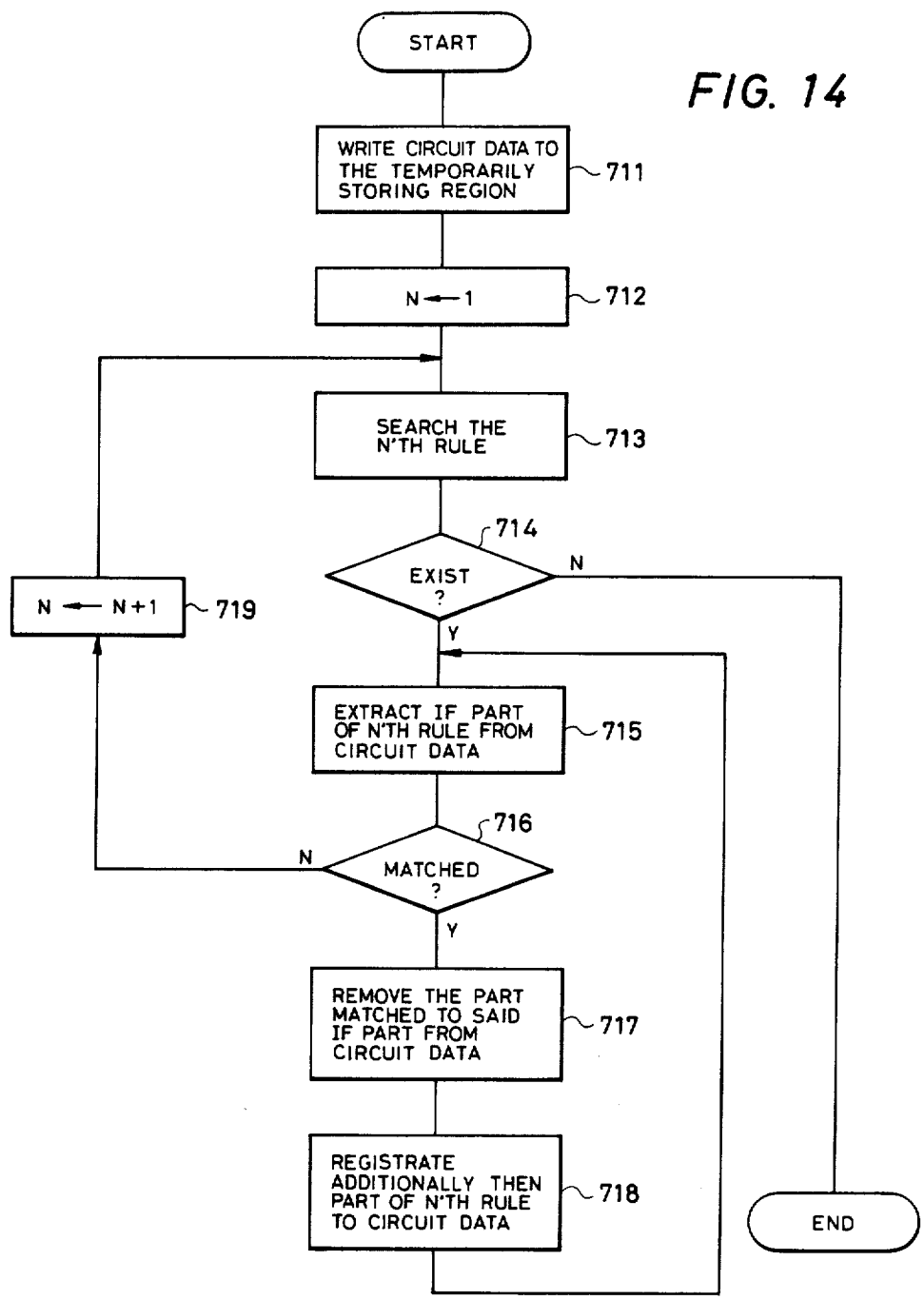
FIG. 14 is a diagram which schematically illustrates the processing of the basic structure generating part according to the present invention.

FIG. 14 is a flow chart which schematically illustrates the processing of the basic structure generating part 310 of FIG. 1. The processing contents of FIG. 14 resemble those of the processing of FIG. 12. First, a step same as the processing step 701 of FIG. 12 is carried out, and the circuit data temporarily storing region 800 prepared in the step 701 of FIG. 12 may be utilized (step 711). Then, 1 is set to the rule priority number N (step 712). A rule of the priority number N is retrieved from the concept extracting rules 220 (step 713). When the rule is retrieved, the program proceeds to a processing step 715. When the rule is not retrieved, the processing of the basic structure generating part 310 is finished (step 714). A part of which the pattern matches with the IF part of the rule of the priority number N retrieved in the step 713, is extracted from the whole data in the circuit data temporarily storing region 800 of FIG. 13 (step 715). Here, the pattern matching is effected by the same method as that of the processing step 703 of FIG. 12. Here, the circuit structure data 30 may be utilized in the step 715 to increase the extracting efficiency. If there exists the part of which the pattern matches, the program proceeds to a step 717. If there does not exist such a part, the program proceeds to a step 719 (step 716). The step 717 removes the part that is matched in the step 715 from the circuit data temporarily storing region 800. A step 718 additionally registers a THEN part that corresponds to the IF art matched in the step 715 to the circuit data temporarily storing region 800. Here, like in the step 709 of FIG. 12, when the IF part and the THEN part contain the same variable, the THEN part of which the variable is replaced by an object with which the variable of the IF part matches, is additionally registered into the temporarily storing region 800. A step 719 adds 1 to the priority number N, and sets the resulting value again to N.

A region for storing the data before and after the translation will now be described and, then, the basic concept translating part 320 and the target circuit generating part 330 of FIG. 1 will be described.

FIG. 15 is a diagram which explains the region for temporarily storing the data before and after the translation. A region 830 for temporarily storing the data before the translation and a region 840 for temporarily storing the data after the translation, have the same format as the region 800 for temporarily storing the circuit data of FIG. 13.

Figure 16:
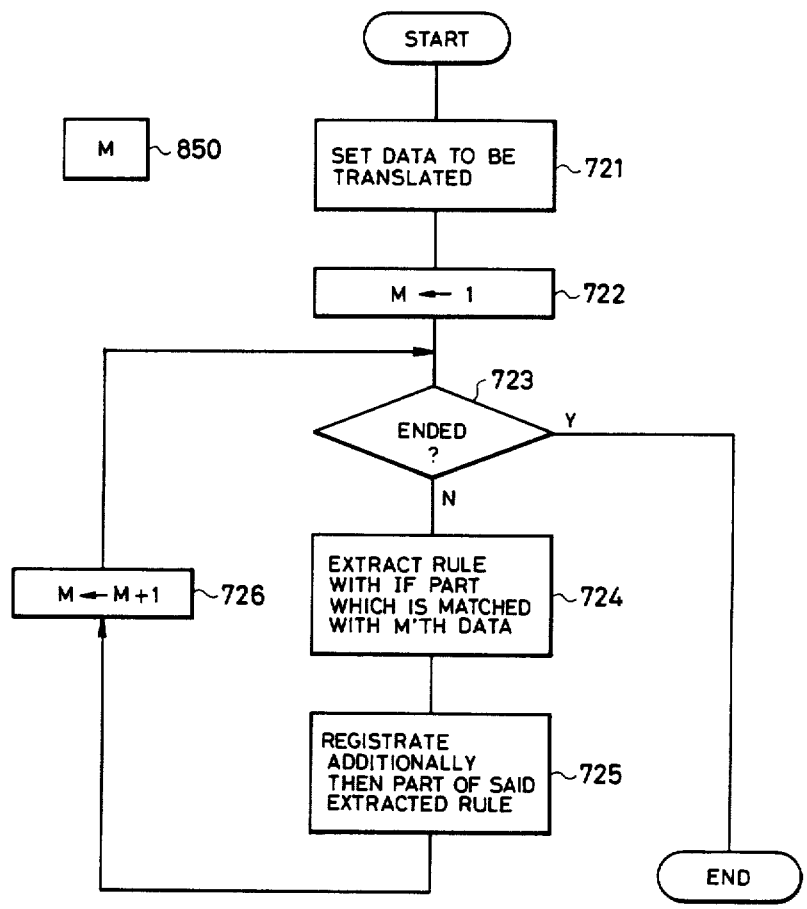
FIG. 16 is a diagram which schematically illustrates the processing of the basic concept translating part and the target circuit generating part according to the present invention.

FIG. 16 is a flow chart which schematically illustrates the processing contents that are to be carried out by the basic concept translating part 320 and by the target circuit generating part 330 of FIG. 1. The basic concept translating part 320 and the target circuit generating part 330 can be realized by nearly the same processing with the exception of difference with regard to the basic concept translating rule 230 and the target circuit generating rule 240.

First, the circuit data to be translated is set to the region 830 which temporarily stores the circuit data before the translation of FIG. 15, and the region 840 which temporarily stores the circuit data after the translation is cleared (step 721). In the basic concept translating part 320, however, the whole or part of the data in the circuit data temporarily storing region 800 is set to the temporarily storing region 830. In the target circuit generating part 330, on the other hand, the whole data of the temporarily storing region 840 are transferred onto the temporarily storing region 830 after the basic concept translating part 320 has been executed.

Next, a value 1 is set to a counter (i.e., set to the orderly number from the head of the record which stores the circuit data) M of the circuit data (step 722). When the processing of the final data set to the temporarily storing region 830 is finished, the processing of the processing block 320 or 330 is finished (step 723). A rule is extracted in which an M-th data set to the temporarily storing region 830 has a pattern that matches with the IF portion in the rule group (i.e., in the basic concept translating rule group 230 or in the target circuit generating rule group 240 of FIG. 1) (step 724). Here, the pattern matching is effected by the same method as the processing step 703 of FIG. 12. In the case of the target circuit generating part 330, fan out numbers of the elements are necessary to effect the pattern matching. For this purpose, the circuit structure data 30 are referred to. Next, the THEN part of the rule extracted in the step 715 is additionally registered onto the temporarily storing region (step 725). However, when the IF part and the THEN part contain the same variable like in the step 709 of FIG. 12, the THEN part of which the variable is replaced by an object with which the variable of the IF part matches, is additionally registered onto the temporarily storing region 840. Then, 1 is added to a value of the counter M, and the resulting value is set again to M (step 726). After the target circuit generating part 330 has been executed, the whole data registered onto the temporarily storing region 840 are additionally registered onto the intermediate circuit data 31.

The target circuit optimizing part 340 of FIG. 1 can basically be realized by the same processing contents as those shown in FIG. 14. In the processing contents shown in FIG. 14, however, the following points must be changed.

(a) The processing step 711 reads the intermediate circuit data 31 as circuit data to be set to the circuit data temporarily storing region 800.

(b) The processing step 713 employs the target circuit optimizing rule 250 of FIG. 1 as a rule to be applied.

(c) After the processings of FIG. 14 have all been finished, the circuit data stored in the circuit data temporarily storing region 800 are all registered onto the target circuit data 22.

In FIGS. 12, 14 and 16, furthermore, the IF part and the THEN part are corresponded to the conditional part and the conclusion part of FIGS. 6, 7, 8 and 9, respectively.

This embodiment makes it possible to automatically carry out the translation operation from a logic diagram of CMOS circuit into an IIL circuit to a degree comparable with that performed by human hand, that will be required in the future for developing analog-digital hybrid VLSI circuits for civil use.

In translating CMOS into IIL, the translation rules of elements change depending upon the coupling relations to other elements and results of translation of other elements. Therefore, it was so far difficult to establish the translation rules to a degree comparable with that by human hand. With the conventional automatic translation system, therefore, the number of elements (i.e., the number of IIL elements) was greater than that of the translation performed by hand by a skilled person. According to a system disclosed in Japanese Patent Application No. 82400/1985, for example, the number of elements is about twice that of the translation performed by human hand. According to this embodiment, on the other hand, the results of translation are obtained to a degree comparable with that performed by human hand of a skilled person as shown in FIG. 11.

According to this embodiment, furthermore, rules can be easily established concerning knowledge of translation of a skilled person as shown in FIGS. 6, 7, 8 and 9. Particularly, the rules shown in FIG. 6 can be easily prepared from the Boolean equation. Compared with the conventional automatic translation systems, furthermore, this embodiment makes it possible to reduce the number of rules that must be prepared based upon the knowledge of a skilled person and, hence, to greatly reduce the number of steps for preparing rules.

According to the present invention as described in the foregoing, a circuit diagram can be automatically translated maintaining high performance to realize a circuit having an equivalent function using different devices. Therefore, errors are prevented from entering, the circuit after the translation is optimized, the circuit is translated within a reduced period of time, quality is improved, and the number of design steps is decreased. Moreover, different circuits of the original circuit system or the target circuit system can be easily translated by replacing the translation rules. Therefore, the translation can be effected to a high degree with a reduced number of rules, and rules can be easily established concerning knowledge of a skilled person. This makes it possible to increase the efficiency for preparing the rules and to decrease the number of steps for developing the circuit translation system.

What is claimed is:

1. A circuit translator for translating an original circuit constituted by a set of first elements into a logically equivalent target circuit constituted by a set of second elements, comprising:
    a first memory section which stores translation rules for translating in the set of said first elements;
    a second memory section which stores translation rules for translation in the set of said second elements;
    a third memory section which stores translation rules for translation of the set of said first elements into the set of said second elements and
    translation means which permits translation rules automatically selected from said first memory section to act upon original circuit data to translate the data into first intermediate data, which permits translation rules automatically selected from said third memory section to act upon said first intermediate data to translate the data into second intermediate data, and which permits translation rules automatically selected from said second memory section to act upon said second intermediate data to translate the data into target circuit data.

2. A circuit translator according to claim 1, wherein the translation rules stored in said first memory section are constituted by connecting relation extracting rules that are used for preparing decision data to determine a connecting relation among the elements of the original circuit and a function produced by the elements in the original circuit, and basic concept extracting rules for extracting basic concepts in the original circuit system, and wherein said translation means selected said connecting relation extracting rules and said basic concept extracting rules, and permits them to act upon the original circuit data to translate said original circuit data into first intermediate data.

3. A circuit translator according to claim 1, wherein translation rules stored in said third memory section are constituted by basic concept translating rules that translate basic elements of translation in the original circuit system into basic elements in the target circuit system.

4. A circuit translator according to claim 1, wherein the translation rules stored in said second memory section are constituted by the target circuit generating rules and the target circuit optimizing rules in the target circuit system, and said translation means selects said target circuit generating rules and permits them to act upon said second intermediate data to form from the second intermediate data the target circuit data logically equivalent to the original circuit, and further selects said circuit optimizing rules, and permits them to act upon said target circuit data to optimize the target circuit.

5. A circuit translator according to any one of claim 2 to 4, wherein said first memory section includes means for holding said decision data, and said translation means generates the first intermediate data from the original circuit data using said decision data, and generates the target circuit data from the second intermediate data.

6. A circuit translator according to claim 4, wherein the translation rules stored in said first memory section are constituted by connecting relation extracting rules that are used for preparing decision data to determine a connecting relation among the elements of the original circuit and a function produced by the elements in the original circuit, and basic concept extracting rules for extracting basic concepts in the original circuit system, wherein translation rules stored in said third memory section are constituted by basic concept translating rules that translate basic elements of translation in the original circuit system into basic elements in the target circuit system; and wherein said translation means provides priority for said basic concept extracting rules, said basic concept translating rules, said target circuit generating rules, and said target circuit optimizing rules, and successively selects the rules in the order of decreasing priority until suitable rules are found, and permits the rules to act upon the corresponding data.

7. A method of translating an original circuit constituted by a set of first elements into a logically equivalent target circuit constituted by a set of second elements, comprising the steps of:
    storing first translation rules for translation of the set of first elements into a first memory section;
    storing second translation rules for translation of the set of second elements into a second memory section;
    storing third translation rules for translation of the set of said first elements into the set of said second elements;
    automatically selecting first translation rules from said first memory section;
    translating original circuit data into first intermediate data;
    automatically selecting third translation rules from said third memory section;
    translating said first intermediate data into second intermediate data using said selected third translation rules;
    automatically selecting second translation rules from said second memory section; and
    translating said second intermediate data into target circuit data using said selected translation rules.

8. A method according to claim 7, wherein said first translation rules include connecting relation extracting rules and basic concept extracting rules; and
    wherein said step of translating said original circuit data into said intermediate data includes the steps of:
    selecting said connecting relation extracting rules for determining a connecting relation among said first elements of said original circuit and a function provided by first elements of said original circuit, and selecting said basic concept extracting rules for extracting basic concepts in said original circuit.

9. A method according to claim 7, wherein said third translation rules stored in said memory section include basic concept translating rules for translating basic elements in said original circuit system into basic elements in said target circuit system.

10. A method according to claim 7,
wherein said second translation rules stored in said second memory section include target circuit generating rules and circuit optimizing rules for the target circuit system; and wherein said step of translating said second intermediate data into said target circuit data includes the steps of,
selecting said target circuit generating rules to translate said second intermediate data into said target circuit data which is logically equivalent to said original circuit data, and
selecting said circuit optimizing rules to optimize said target circuit data.

11. A method according to claim 8, wherein said relation extracting rules are used to prepare decision data which is used to translate said original circuit data into first intermediate data.

* * * * *